United States Patent [19]
Mohri

[11] Patent Number: 5,831,432
[45] Date of Patent: Nov. 3, 1998

[54] DIFFERENTIAL MAGNETO-IMPEDANCE MAGNETIC FIELD SENSOR

[75] Inventor: Kaneo Mohri, Nagoya, Japan

[73] Assignee: Research Development Corporation of Japan, Japan

[21] Appl. No.: 655,433

[22] Filed: May 30, 1996

[30] Foreign Application Priority Data

Nov. 9, 1995 [JP] Japan ................................... 7-291450

[51] Int. Cl.⁶ .......................... G01R 33/02; G01R 33/04; H01F 21/02; G01B 5/127
[52] U.S. Cl. ........................................... 324/249; 324/253
[58] Field of Search ........................... 324/249, 253–255, 324/247, 244, 260

[56] References Cited

U.S. PATENT DOCUMENTS

| | | | |
|---|---|---|---|
| 3,621,382 | 11/1971 | Valet | 324/249 |
| 4,739,263 | 4/1988 | Mohri et al. | 324/247 |

FOREIGN PATENT DOCUMENTS 7181239  7/1995  Japan.

OTHER PUBLICATIONS

IEEE Transactions on Magnetics, vol. 31, No. 6, Nov. 1995 pp. 3134–3136, Bushida et al.

*Primary Examiner*—Walter E. Snow
*Attorney, Agent, or Firm*—Lorusso & Loud

[57] ABSTRACT

A magnetic field sensor for gradient field detection (gradient type magnetic field sensor) cancels relatively uniform disturbance magnetic fields (background magnetic fields) such as the terrestrial field through the use of two magneto-impedance elements, thereby making it possible to detect only a signal magnetic field (gradient field) which is considerably localized spatially. The magnetic field sensor includes a pair of sensor heads made of an amorphous wire, and a self-oscillation type electronic circuit for detecting a spatially uniform magnetic field or a differential value of a spatially gradient magnetic field by switching the direction of a bias magnetic field applied to the pair of sensor heads.

11 Claims, 5 Drawing Sheets

DETECTION OF UNIFORM
MAGNETIC FIELD (SW1 ON)

DETECTION OF GRADIENT
MAGNETIC FIELD (SW1 OFF)

Hb : BIAS MAGNETIC FIELD

F I G. 4
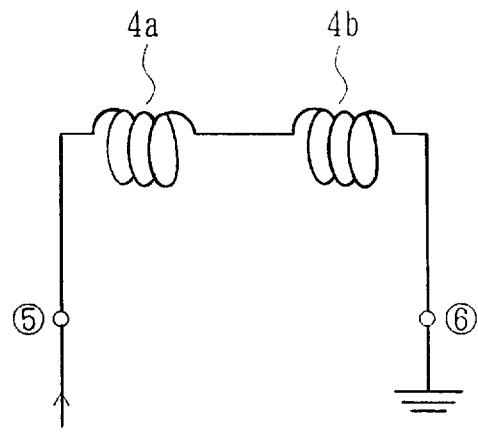
F I G. 5
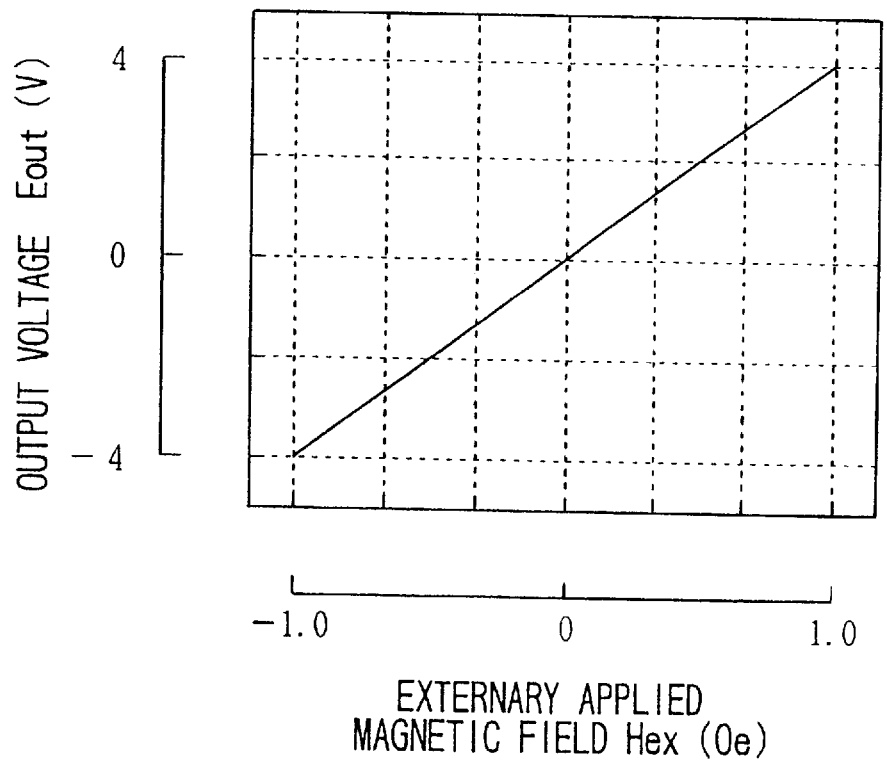

AMORPHOUS WIRE MI HEAD (LENGTH : 3mm)
DIAMETER : 19mm  1000 POLES (POLE PITCH : 60μm)

AMORPHOUS WIRE MI HEAD (LENGTH : 1mm)
DIAMETER : 19mm  2000 POLES (POLE PITCH : 30μm)

DIFFERENTIAL MAGNETO-IMPEDANCE MAGNETIC FIELD SENSOR

BACKGROUND OF THE INVENTION

1. Field of the Invention

The present invention relates to a magnetic field sensor, and more particularly to a magnetic field sensor which can detect gradient magnetic fields and which can be used in various technical fields.

The magnetic field sensor of the present invention can be used as a magnetic sensor head for a rotary encoder used for sophisticated arm control of an industrial robot in which the magnetic sensor head is combined with a high density ring magnet, as a sensitive magnetic sensor head for magnetic inspection, as a magnetic sensor head for detecting the image of magnetic domains of a magnetic material, as a magnetic sensor head for a high density magnetic disc of a computer, as a magnetic sensor head for a rotary encoder used for controlling the rotation of a storage disc of a computer in which the magnetic sensor head is combined with a ring magnet, as a magnetic sensor for detecting a magnetic field of an automobile, as a magnetic direction sensor, as any one of various types of magnetic sensors for current detection, or as a like device.

2. Description of the Related Art

The use of magnetic sensor heads is a key technology in the modern computerized society which has progressed more and more. Various magnetic sensor heads such as a magnetic sensor head for a rotary encoder used in an industrial robot, a sensitive magnetic sensor head for magnetic inspection, a magnetic sensor head for detecting magnetic domains of a magnetic material, a magnetic sensor head for a high density magnetic disc, and a magnetic sensor head for a rotary encoder used for controlling the rotation of a storage disc are all required to detect weak signal magnetic fields, which have recently become more and more weakened. Also, such magnetic sensor heads are required to detect only a signal magnetic field in a disturbance field or background field stronger than the signal magnetic field, such as the terrestrial field.

For these purposes, a magnetic field sensor is needed which can cancel disturbance fields, which are spatially uniform as compared with a signal magnetic field, so as to detect, as a differential magnetic field, only the signal magnetic field which is spatially gradient.

Further, it is essential for the magnetic field sensors used in the above-described technical fields not only to have a high sensitivity but also to have a miniature size and a high response speed. Currently, only magneto-impedance (MI) elements meet the above-described requirements.

Neither Hall elements nor magneto resistance (MR) elements have sufficient sensitivity. Although flux gate sensors have high sensitivity for uniform magnetic fields, they are not satisfactory in terms of their sizes and response speeds.

The MI element proposed by the present inventors (Japanese Patent Application Laid-open (kokai) No. 7-181239) has a high resolution of $10^{-6}$ Oe in detecting alternating magnetic fields, a very high sensitivity, and a high response speed which allows detection of magnetic fields from DC (0 Hz) to a few MHz, despite its compact size of about 1 mm long. Also, since the power consumption of the entire sensor circuit is not greater than about 40 mW, it is easy to assemble a sensor array using these MI elements. None of various types of conventional magnetic sensors possesses these excellent characteristics.

Actually, with the current progress of technology, the strengths of magnetic fields to be measured have been decreased and the frequencies of magnetic fields to be measured have been increased, especially in the fields of computers, information equipment, mechatoronics, power electronics, medical electronics, industrial measurement, and environmental measurement. For example, in detection of the surface magnetic field of a high density magnetic disc or of a high density ring magnet of a rotary encoder, or in high speed magnetic detection of pin holes, the strengths of magnetic fields are on the order of milli Oe, and the frequencies of the magnetic fields range from a few tens of kHz to a few hundreds of kHz. Therefore, conventional Hall elements, MR elements, and the like cannot be used due to their insufficient sensitivities. Conventional flux gate sensors cannot be used due to their insufficient response speeds and large head lengths.

Since only MI elements can achieve the new goal of magnetic measurement, it is desired to put the MI elements into practical use.

Also, in magnetic measurement which can achieve the new goal, many cases occur in which signal magnetic fields to be measured are weaker than the background magnetic field such as the terrestrial field (about 0.3 Oe). Therefore, magnetic fields sensors used in such measurement must have robustness (ability of detecting only signal magnetic fields without being affected by disturbance magnetic fields).

A method is known for detecting a gradient magnetic field while canceling the background magnetic field. For example, such a method has been proposed in relation to a gradio meter of SQUID (superconductive quantum interference device). However, such a method has yet not been proposed for MI elements, which are new high performance micro magnetic field sensors.

SUMMARY OF THE INVENTION

An object of the present invention is to solve the above-mentioned problems in the conventional magnetic field sensors and to provide a magnetic field sensor for gradient field detection (gradient type magnetic field sensor) which can cancel relatively uniform disturbance magnetic fields (background magnetic fields), such as the terrestrial field, through the use of two magneto-impedance elements, thereby making it possible to detect only a signal magnetic field (gradient field) which is considerably localized spatially.

To achieve the above objects, according to a first aspect the present invention provides a magnetic field sensor comprising a pair of sensor heads made of a magnetic member, and a detection means for detecting a spatially uniform magnetic field or a differential value of a spatially gradient magnetic field by switching the direction of a bias magnetic field.

Preferably, the detection means is composed of a self-oscillation type electronic circuit.

In this case, the said self-oscillation type electronic circuit preferably comprises a multivibrator high frequency oscillator which has a pair of transistors and performs amplitude modulation.

Preferably, the sensor heads operate through a magneto-impedance effect or a magneto-inductance effect.

Preferably, the sensor heads are made of an amorphous wire or a thin film.

When the sensor heads is made of an amorphous wire, it is preferred to provide electrodes at three different locations on said amorphous wire, whereby two portions of said amorphous wire between said electrodes function as said pair of sensor heads.

Preferably, the bias magnetic field of the detection means is generated by supplying a direct current to coils wound around the magnetic member of the sensor heads.

According to a second aspect of the present invention, there is provided a magnetic field sensor comprising a pair of sensor heads made of a magnetic member, bias magnetic field generation means for applying a bias magnetic field to the pair of sensor heads, and detection means for detecting a differential value of a spatially gradient magnetic field based on the impedances or inductances of the pair of sensor heads.

Preferably, the detection means is composed of a self-oscillation type electronic circuit.

In this case, the said self-oscillation type electronic circuit preferably comprises a multivibrator high frequency oscillator which has a pair of transistors and performs amplitude modulation.

Preferably, the sensor heads are made of an amorphous wire or a thin film.

When the sensor heads are made of an amorphous wire, it is preferred to provide electrodes at three different locations on said amorphous wire, whereby two portions of said amorphous wire between said electrodes function as said pair of sensor heads.

Preferably, the bias magnetic field generation means comprises coils wound around the magnetic member of the sensor heads, and a power supply for supplying a direct current to the coils.

Preferably, there are further provided feedback coils wound around the magnetic member of the sensor heads, the feedback coils being connected to the output of the magnetic field sensor.

With the above-described structure, it becomes possible to provide a magnetic field sensor for gradient field detection (gradient type magnetic field sensor) which can cancel relatively uniform disturbance magnetic fields (background magnetic fields) such as the terrestrial field through the use of two magneto-impedance elements, thereby making it possible to detect only a signal magnetic field (gradient field) which is considerably localized spatially.

When the self-oscillation type electronic circuit comprises a multivibrator high frequency oscillator which has a pair of transistors and performs amplitude modulation, it becomes possible to obtain a magnetic field sensor which is highly sensitive and operates stably.

BRIEF DESCRIPTION OF THE DRAWINGS

FIG. 4 is a circuit diagram showing the interconnection between two feedback coils of the magnetic field sensor of the embodiment;

FIG. 5 is a characteristic chart (characteristic chart for detection of uniform magnetic fields) of the magnetic field sensor of the present invention showing the relationship between an externally applied magnetic field and the output voltage;

DETAILED DESCRIPTION OF THE PREFERRED EMBODIMENT

An embodiment of the present invention will now be described with reference to the accompanying drawings.

Figure 1:
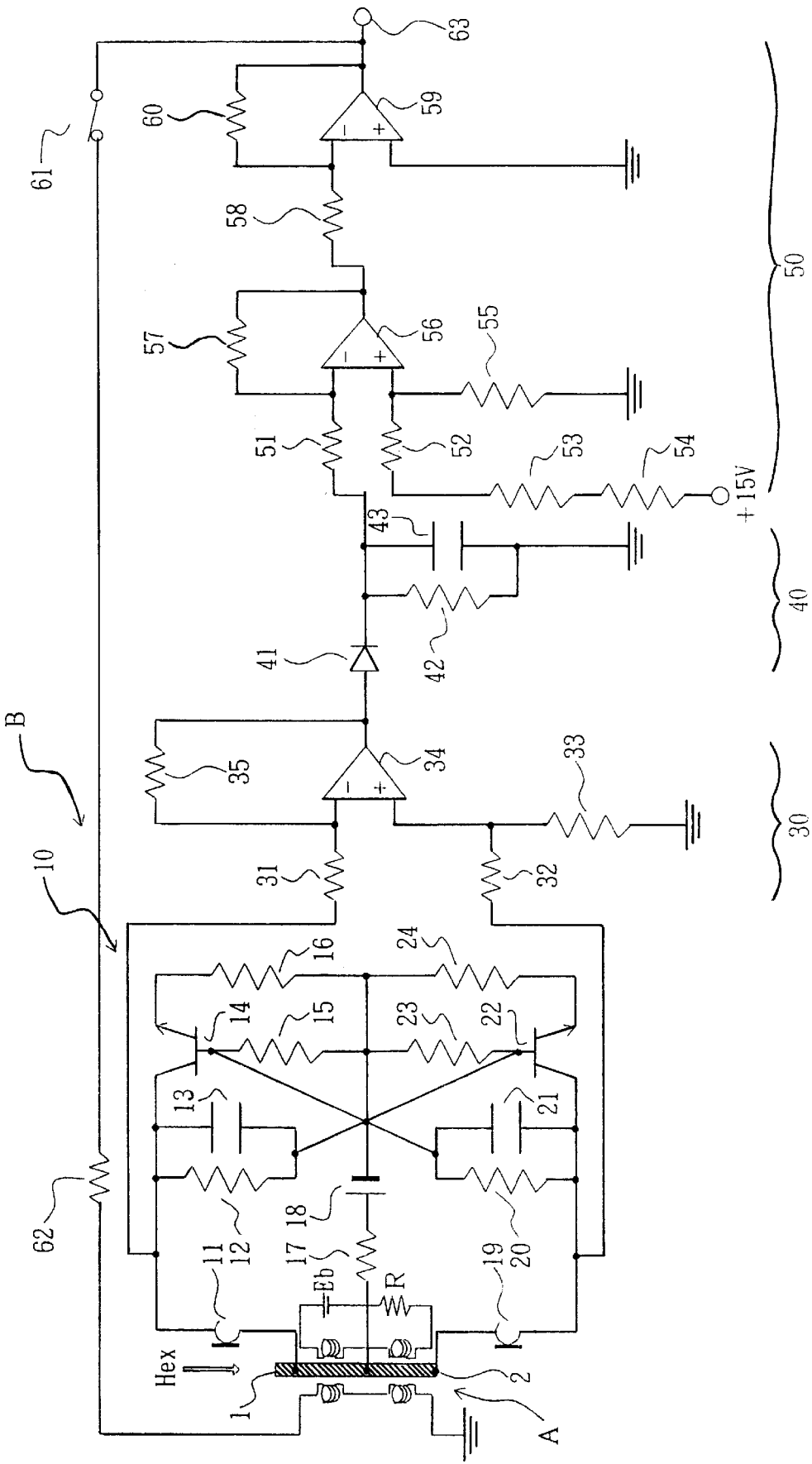
FIG. 1 is a diagram showing the overall structure of a magnetic field sensor according to an embodiment of the present invention.
Figure 2:
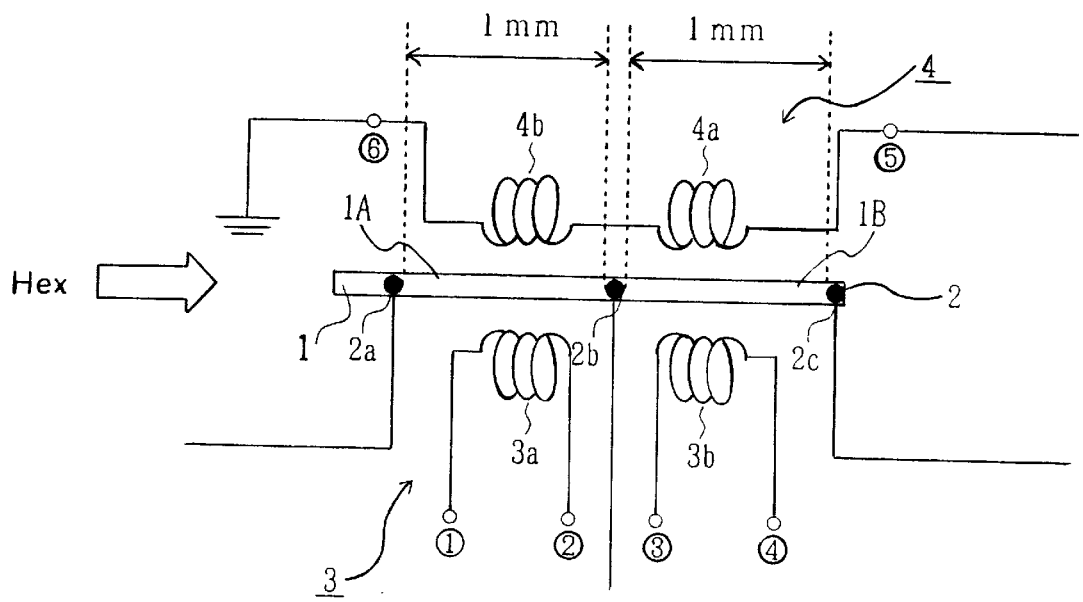
FIG. 2 is a view showing the structure of the head portion of the magnetic field sensor of the embodiment.
Figure 3A:
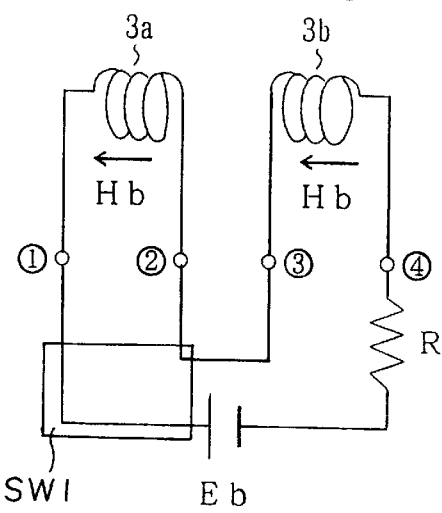
FIGS. 3A and 3B are circuit diagrams each showing the interconnection between two bias coils of the magnetic field sensor of the embodiment.
Figure 3B:
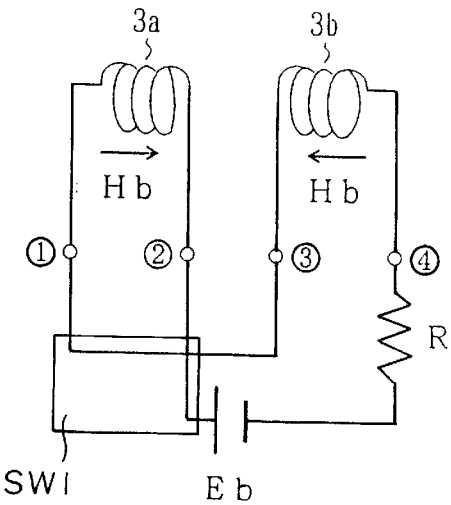

FIG. 1 shows the overall structure of a magnetic field sensor according to an embodiment of the present invention, FIG. 2 shows the structure of the head portion of the magnetic field sensor, FIG. 3A shows the interconnection between two bias coils of the magnetic field sensor for detection of uniform magnetic fields, FIG. 3B shows the interconnection between the two bias coils of the magnetic field sensor for detection of gradient magnetic fields, and FIG. 4 shows the interconnection between two feedback coils of the magnetic field sensor.

As shown in these drawings, the magnetic field sensor includes a pair of sensor heads A and a self-oscillation type electronic circuit B. The pair of sensor heads A includes a common amorphous wire 1 (magnetostriction: 0, diameter: 30 $\mu$m, length: about 3 mm) serving as a magnetic member. Soldering electrode terminals 2 (2a, 2b and 2c) are provided at three different locations on the amorphous wire 1. Two portions, 1A and 1B, of the amorphous wire 1 between the electrode terminals 2 serve as the pair of sensor heads A. The amorphous wire 1 is made of, for example, an FeCoSiB material. A tensile stress of 2 kg/mm$^2$ is applied to the FeCoSiB material during an annealing process in which the FeCoSiB material is heated at 475° C. for one minute and is then cooled to room temperature.

As shown in FIG. 2, two bias coils 3 (3a and 3b) and two feedback coils 4 (4a and 4b) are wound around the pair of sensor heads A formed of a magnetic member.

When a uniform magnetic field is detected (switch 61 shown in FIG. 1 is closed and switch SW1 as shown in FIG. 3A is on), the bias coils 3a and 3b are connected to a DC power supply Eb through a resistor R (100$\Omega$) such that the bias coils 3a and 3b generate bias magnetic fields oriented in the same direction, as shown in FIG. 3A. On the contrary, when a gradient magnetic field is detected (switch 61 is open and switch SW1 as shown in FIG. 3B is off), the bias coils 3a and 3b are connected to the DC power supply Eb through the resistor R (100$\Omega$) such that the bias coils 3a and 3b generate bias magnetic fields oriented in opposite directions, as shown in FIG. 3B.

Also, as shown in FIG. 4, the feedback coils 4a and 4b are connected to the output of the self-oscillation type electronic circuit B through the feedback switch 61 and a feedback resistor 62 (see FIG. 1) such that the feedback coils 4a and 4b generate magnetic fields oriented in the same direction.

The self-oscillation type electronic circuit B consists of a multivibrator oscillation circuit 10, a differential amplifier 30, a detection circuit 40, and an output-stage amplifier 50.

The multivibrator oscillation circuit 10 consists of a resistor 17 (R: 10$\Omega$), a DC power supply 18 (E), inductances 11 and 19 [chip elements ($L_{chip}$): 0.12 $\mu$H] resistors 12 and 20 ($R_{b1}$ and $R_{b2}$ 20 k$\Omega$), capacitors 13 and 21 ($C_{b1}$ and $C_{b2}$: 220 pF), transistors 14 and 22 (Tr1 and Tr2: 2SC1162), resistors 15 and 23 (R: 30 kΩ), and resistors 16 and 24 (R$_0$: 3Ω). The multivibrator oscillation circuit 10 is connected to the differential amplifier 30.

The differential amplifier 30 consists of resistors 31 and 32 (R$_1$ and R$_2$: 510Ω), a resistor 33 (R$_4$: 1 kΩ), an operational amplifier 34 (OP1: LM6361N) and a resistor 35 (R$_3$: 1 kΩ), and is connected to the detection circuit 40.

The detection circuit 40 consists of a schottky barrier diode 41 (D: 1SS97), and an RC circuit consisting of a resistor 42 (R$_5$: 300 kΩ) and a capacitor 43 (C$_1$: 2200 pF). The detection circuit 40 is connected to the output-stage amplifier 50.

The output-stage amplifier 50 consists of resistors 51, 52 and 53 (R$_6$, R$_7$ and R$_{12}$: 10 kΩ), a variable resistor 54 (R$_{13}$: max. 5 kΩ), a resistor 55 (R$_9$: 100 kΩ), an operational amplifier 56 (OP2: LM356N), a resistor 57 (R$_8$: 100 kΩ), a resistor 58 (R$_{10}$: 1 kΩ), an operational amplifier 59 (OP3: LM356N), and a resistor 60 (R$_{11}$: 100 kΩ). Numeral 61 denotes the above-mentioned feedback switch, and numeral 62 denotes the above-mentioned feedback resistor (Rf: max. 3 kΩ) The feedback resistor 62 is grounded through the feedback coils 4a and 4b serially connected to the feedback resistor 62. Numeral 63 denotes an output terminal.

The multivibrator oscillation circuit 10 oscillates at about 20 MHz, and the oscillation voltage thereof undergoes amplitude modulation due to an externally applied magnetic field Hex. The modulated oscillation voltage is supplied, through the differential amplifier 30, to the detection circuit 40 having the above-mentioned Schottky barrier diode 41 and the RC circuit consisting of the resistor 42 and the capacitor 43, in which the modulated oscillation voltage is detected. The detection voltage output from the detection circuit 40 is amplified by the operational amplifiers 56 and 59 to a sufficient level, so that an output voltage Eout is obtained from the output terminal 63.

At this time, when bias magnetic fields Hb oriented in the same direction are generated at the two portions 1A and 1B of the amorphous wire 1 serving as the sensor heads A, as shown in FIG. 3A, the output voltage Eout is proportional to the externally applied magnetic field Hex. In other words, the magnetic field sensor functions as a linear magnetic field sensor.

On the contrary, when bias magnetic fields Hb oriented in opposite directions are generated at the two portions 1A and 1B of the amorphous wire 1 serving as the sensor heads A, as shown in FIG. 3B, the output voltage Eout is proportional to the difference in the magnetic field strength between the two portions 1A and 1B of the amorphous wire 1 serving as the sensor heads A.

In the former case, a current proportional to the output voltage Eout is supplied to the feedback coils 4a and 4b of the sensor heads A via the closed switch 61 and the feedback resistor 62. This constitutes a strong negative feedback circuit, thereby remarkably improving the linearity and response speed of the magnetic field sensor.

FIG. 5 is a characteristic chart (characteristic chart for detection of uniform magnetic fields) of the magnetic field sensor of the present invention, which shows the relationship between an externally applied magnetic field and the output voltage. This characteristic chart shows the characteristic when the magnitude of a sinusoidal magnetic field (frequency: 1 kHz) is varied from −1 Oe (oersted) to +1 Oe. The magnetic field sensor of the present invention exhibits a nonlinearity of 0.2% or less at the full scale, so that it has an excellent linearity. The minimum detectable strength of the magnetic field is about $10^{-6}$ Oe.

Figure 6:
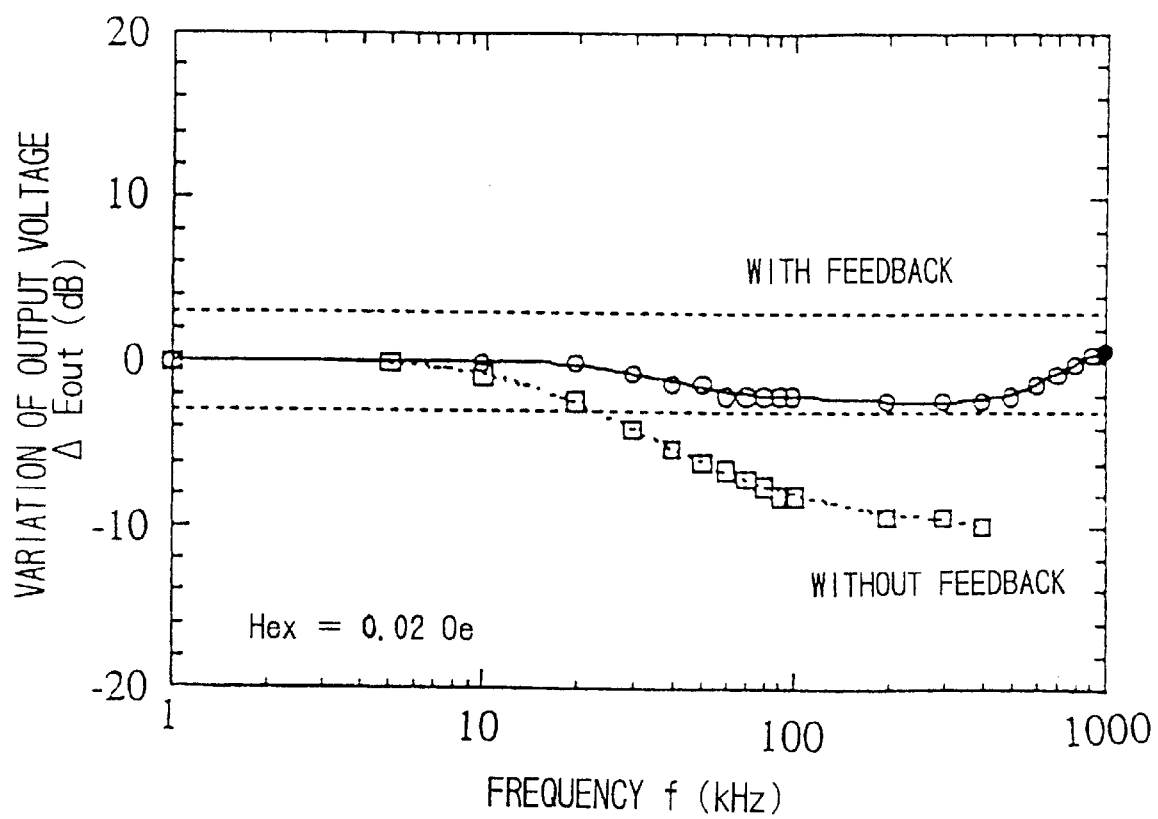
FIG. 6 is a characteristic chart showing the frequency characteristic of the magnetic field sensor of the present invention.

FIG. 6 is a characteristic chart showing the frequency characteristic of the magnetic field sensor of the present invention. This chart shows the detection characteristic (frequency characteristic) when the frequency f of a sinusoidal magnetic field (amplitude: 0.02 Oe) is varied. The horizontal axis represents the frequency (kHz) of the sinusoidal magnetic field while the vertical axis represents the variation Δ Eout (dB) of the output voltage of the sensor.

As shown in FIG. 6, with the above-described negative feedback, magnetic fields having frequencies up to 1 MHz were able to be detected with a variation of less than ±3 dB. When the negative feedback was not used, only magnetic fields up to 20 kHz were able to be detected.

Figure 7A:
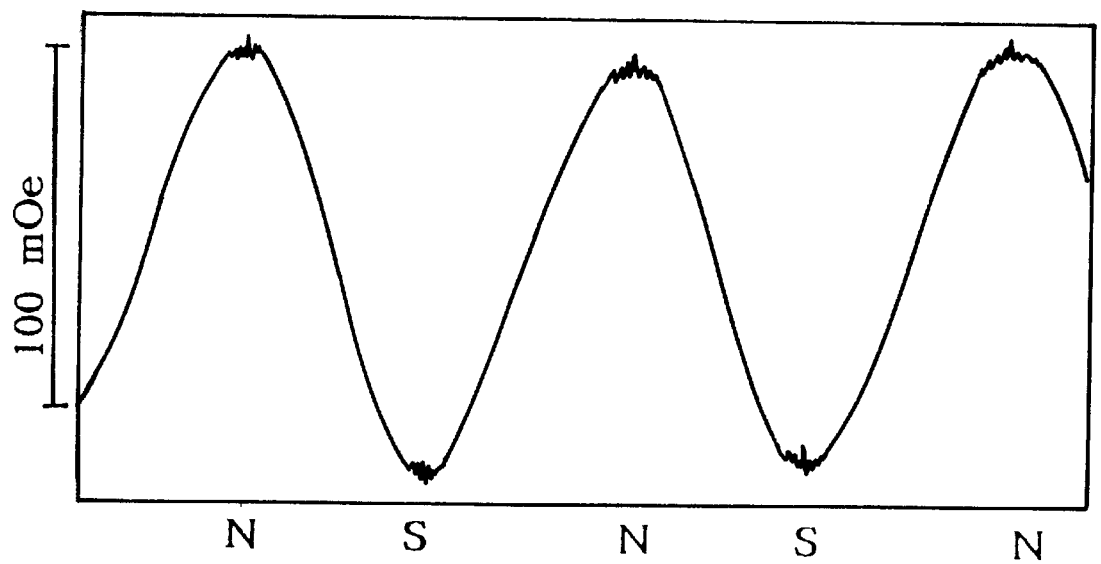
FIGS. 7A and 7B are diagrams showing the results of experiments in which the surface magnetic field of a ring magnet of a rotary encoder for robot control was detected by the magnetic field sensor of the present invention operated in a differential mode.
Figure 7B:
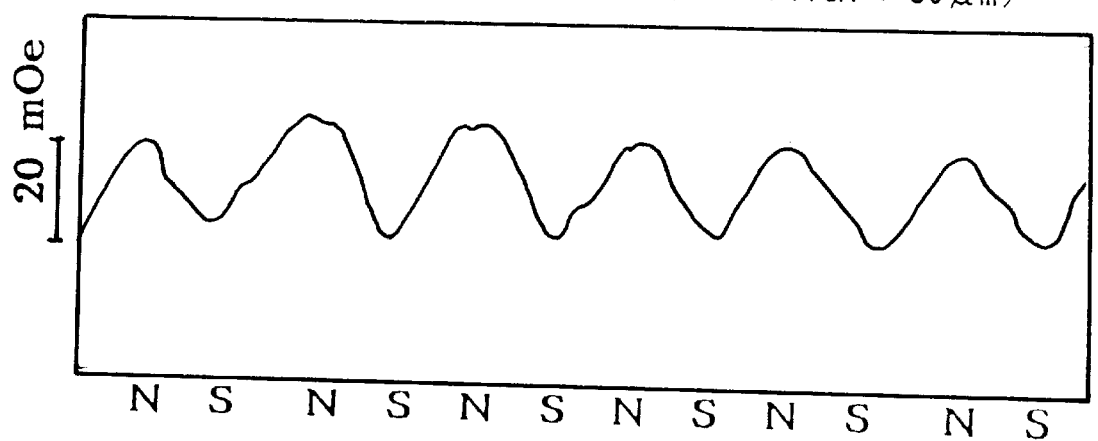

FIGS. 7A and 7B show the results of experiments in which the surface magnetic field of a ring magnet of a rotary encoder for robot control was detected by the magnetic field sensor of the present invention operated in a differential mode.

FIG. 7A shows the case where the ring magnet had a diameter of 19 mm and 1000 magnetic poles (the pitch of magnetic poles: 60 μm), and FIG. 7B shows the case where the ring magnet had a diameter of 19 mm and 2000 magnetic poles (the pitch of magnetic poles: 30 μm). The horizontal axis represents the recurrence of N and S magnetic poles, while the vertical axis represents the sensor output (mOe).

As is apparent from FIGS. 7A and 7B, the circumferential distribution of the surface magnetic field of the rotary encoder for robot control having a diameter of 19 mm and 2000 magnetic poles (the pitch of magnetic poles: 30 μm) was detected stably.

When the magnetic field sensor was used in a differential mode, the negative feedback was not used (switch 61 open). Since the magnetic field sensor was operated in the differential mode, the sensor was not at all affected by the terrestrial field. The influence of the rotor magnetic field of a magnet motor for driving an encoder decreased by about 75% through the operation in the differential mode.

Although in the above-described embodiment, the sensor heads are made of an amorphous wire, an amorphous thin film may be used instead of the amorphous wire.

The values of the circuit components in the drawings are merely example values, and may be varied.

The present invention is not limited to the abovedescribed embodiment. Numerous modifications and variations of the present invention are possible in light of the spirit of the present invention, and they are not excluded from the scope of the present invention.

What is claimed is:

1. A magnetic field sensor comprising:
   (a) a pair of sensor heads made of a magnetic member; and
   (b) detection means for selectively detecting either a spatially uniform magnetic field or a differential value of a spatially gradient magnetic field by switching the direction of a bias magnetic field applied to one of said pair of sensor heads.

2. A magnetic field sensor according to claim 1, wherein said detection means includes a self-oscillation type electronic circuit.

3. A magnetic field sensor according to claim 2, wherein said self-oscillation type electronic circuit comprises a multivibrator high frequency oscillator which has a pair of transistors and performs amplitude modulation.

4. A magnetic field sensor according to claim 1, wherein each of the sensor heads operates through a magneto-impedance effect or a magneto-inductance effect.

5. A magnetic field sensor according to claim 1, wherein the magnetic member of said sensor heads is an amorphous wire.

6. A magnetic field sensor according to claim 5, wherein said amorphous wire is provided with three electrodes formed at different longitudinal locations, and two portions of said amorphous wire between said electrodes function as said pair of sensor heads.

7. A magnetic field sensor according to claim 1, wherein the bias magnetic field of the detection means is generated by applying a direct current to coils wound around the magnetic member of said sensor heads.

8. A magnetic field sensor comprising:
(a) an amorphous magnetic wire provided with three electrodes formed at different longitudinal locations wherein two portions of said amorphous wire between the electrodes function as a pair of sensor heads;
(b) bias magnetic field generation means for applying a bias magnetic field to said pair of sensor heads; and
(c) detection means for detecting a differential value of a spatially gradient magnetic field based on impedances of said pair of sensor heads.

9. A magnetic field sensor according to claim 8, wherein said bias magnetic field generation means applies opposite bias magnetic fields to respective portions of said amorphous wire to form said pair of sensor heads.

10. A magnetic field sensor comprising:
(a) a pair of sensor heads made of a magnetic member having a magneto-impedance effect;
(b) bias magnetic field generation means for applying a bias magnetic field to said pair of sensor heads;
(c) detection means for detecting a differential value of a spatially gradient magnetic field based on the magneto-impedance effect of the magnetic member of said pair of sensor heads, wherein said bias magnetic field generation means comprises coils wound around the magnetic member of said sensor heads, and a power supply for supplying a direct current to said coils.

11. A magnetic field sensor according to claim 10, further comprising feedback coils wound around the magnetic member of said sensor heads, said feedback coils being connected to the output of said magnetic field sensor.

* * * * *